United States Patent [19]
Pattanayak et al.

[11] Patent Number: 4,888,627
[45] Date of Patent: Dec. 19, 1989

[54] MONOLITHICALLY INTEGRATED LATERAL INSULATED GATE SEMICONDUCTOR DEVICE

[75] Inventors: Deva N. Pattanayak; Bantval J. Baliga, both of Schenectady, N.Y.

[73] Assignee: General Electric Company, Schenectady, N.Y.

[21] Appl. No.: 51,427

[22] Filed: May 19, 1987

[51] Int. Cl.[4] .............................................. H01L 29/78
[52] U.S. Cl. .................................... 357/23.4; 357/30; 357/43; 357/38; 357/52; 357/86
[58] Field of Search ................... 357/23, 4, 30, 43, 38, 357/52, 86

[56] References Cited

U.S. PATENT DOCUMENTS

| | | | |
|---|---|---|---|
| 4,199,774 | 4/1980 | Plummer | 357/41 |
| 4,364,073 | 12/1982 | Becke et al. | 357/23 |
| 4,422,089 | 12/1983 | Vaes et al. | 357/23.4 |
| 4,443,931 | 4/1984 | Baliga et al. | 29/571 |
| 4,716,446 | 12/1987 | Esser et al. | 357/23.4 |

OTHER PUBLICATIONS

Plummer, J. D. et al., "Insulated-Gate Planar Thyristors: I-Structure and Basic Operation", *IEEE Trasactions on Electron Devices*, vol. ED-27, No. 2, Feb. 1980, pp. 380-386.
Scharf, B. W. et al., "Insulated-Gate Planar Thyristors: II-Quantitative Modeling", *IEEE Transactions on Electron Devices*, vol. ED-27, No. 3, pp. 386-393.
Russell, J. P. et al., "The COMFET-A New high Conductance MOS-Gated Device", *IEEE Electron Device Letter*, vol. EDL-4, No. 3, Mar. 1983, pp. 63-65.

*Primary Examiner*—Joseph E. Clawson, Jr.
*Attorney, Agent, or Firm*—Robert Ochis; James C. Davis, Jr.; Marvin Snyder

[57] ABSTRACT

A monolithically integrated lateral semiconductor device preferably comprising a pair of inherent transistors driven by an inherent lateral four layer structure is disclosed. The disclosed device includes inherent vertical and lateral bipolar transistors. An inherent lateral four layer structure is also included within the device to provide a sufficient base drive to fully turn on both the lateral and vertical inherent bipolar transistors. The lateral four layer structure can be controlled through an insulated gate.

9 Claims, 9 Drawing Sheets

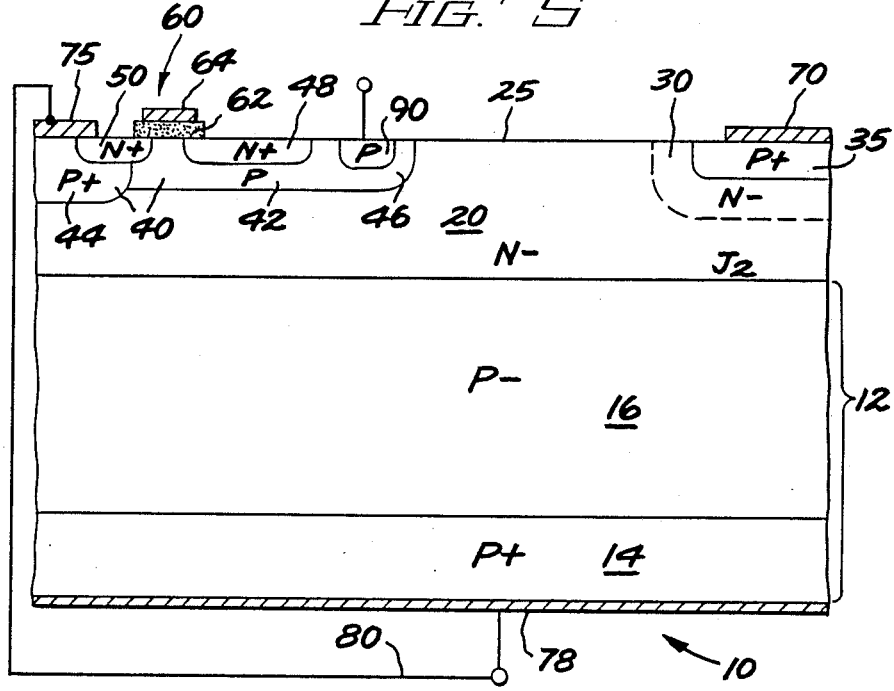
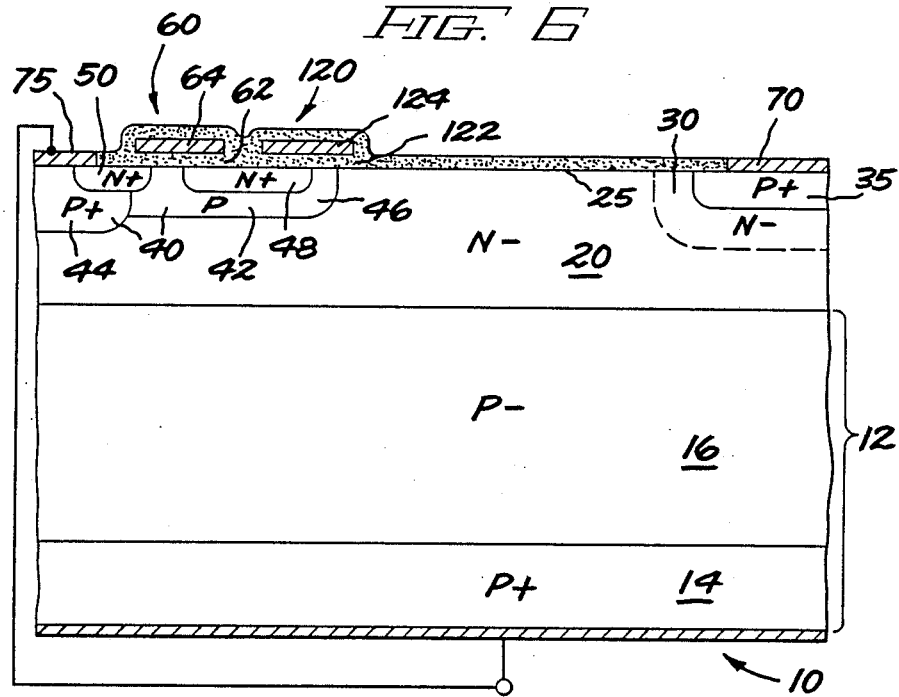

MONOLITHICALLY INTEGRATED LATERAL INSULATED GATE SEMICONDUCTOR DEVICE

This application relates to lateral insulated gate semiconductor devices, and more particularly, to monolithically integrated lateral semiconductor devices which employ a first gate controlled active portion to drive a second portion comprising a three layer structure such as an inherent bipolar transistor. A single control signal applied to a single insulated gate controls all operating modes of the composite device. The device is disclosed in alternate embodiments in which the on-gate is a current activated gate, a light activated gate or an insulated gate.

Related Applications

This application is related to U.S. Patent application Ser. No. (RD-17,185) for "A Monolithically Integrated Insulated Gate Semiconductor Device" and U.S. patent application Ser. No. (RD-17,250) for "Improved Insulated Gate Semiconductor Device and Process for Fabrication", U.S. patent application Ser. No. (RD-17,295) for "Monolithically Integrated Bidirectional Lateral Semiconductor Device With Insulated Gate Control in Both Directions and Method of Fabrication" and application Ser. No. (RD-17,298) for "Monolithically Integrated Semiconductor Device Having Bidirectional Conducting Capability and Method of Fabrication" each of which is filed concurrently herewith, assigned to the assignee hereof and is expressly incorporated by reference herein.

BACKGROUND OF THE INVENTION

Lateral insulated gate controlled transistors have been proposed in which a gate is used to control the conductance of an inherent bipolar transistor. An example of one such device is shown in FIG. 1 of this application and an equivalent circuit derived from the device is shown in FIG. 2. FIG. 1 is based on U.S. patent application Ser. No. 803,049 for "A Lateral insulated Gate Transistor With Improved Latch Up Immunity" assigned to the assignee of the present invention. In these structures, the MOS channel controls the base current to the vertical and lateral bipolar transistor elements. The base current promotes carrier injection from the common anode to both the lateral and vertical transistors and the long drift region, required to support voltage during the off-state of the device, gets conductively modulated. The degree of conductivity modulation depends upon the base drive. This insulated gate channel resistance reduces the amount of base drive that can be supplied to the base of the inherent bipolar transistor and consequently impairs the degree to which the inherent bipolar transistor can be turned on. In the insulated gate structures heretofore known, while the inherent transistor has been activated, the inherent transistor has not been fully turned on under conventional operation conditions due to a lack of sufficient base drive. More particularly, in typical lateral insulated gate transistors, the inherent bipolar transistor is believed to operate at between 40% and 50% of its capacity.

Thus an unfulfilled need exists to provide a lateral insulated gate semiconductor device which fully utilizes an inherent bipolar transistor structure under normal operating conditions.

OBJECTS OF THE INVENTION

A principal object of the invention is to provide an improved lateral insulated gate semiconductor device having vertical and lateral inherent transistors in which the inherent transistors are fully utilized and achieve, under normal operating conditions, higher conductivity modulation of the drive region leading to increased level of current conduction.

An additional object of the present invention is to provide a lateral insulated gate semiconductor device comprising a monolithically integrated combination of a five region structure such as an active portion or a novel thyristor and a three layer structure such as an inherent bipolar transistor wherein the active portion of the device can be decoupled from a cathode electrode by a single insulated gate to turn the device off.

A still further object of the present invention is to provide a semiconductor device which includes an active device portion proximate an inherent transistor portion to thereby cause the active device portion to establish a high carrier density in the base of the transistor portion and to reduce the series resistance of the transistor portion by further increasing its conductivity modulation.

SUMMARY OF THE INVENTION

These and other objects and features of the present invention are achieved in a monolithically integrated lateral insulated gate semiconductor device comprising a first layer of one type conductivity semiconductor material and a second layer of opposite type conductivity material disposed thereon. The first layer, in a preferred embodiment, can comprise a heavily doped first portion and a lightly doped second portion disposed between the heavily doped first portion and the second layer. The second layer can be a lightly doped voltage supporting layer and a first region of opposite type conductivity can be disposed within the second layer as a buffer region to prevent punch through breakdown. A second region of one type conductivity is disposed within the second layer preferably within the first region and forms a PN junction therewith.

A third region of one type conductivity is disposed within the second layer in opposed relation to the second region. The third region also forms a PN junction with the second layer. The third region preferably comprises a heavily doped first portion and a more lightly doped second portion. The heavily doped first portion can be discrete from the more lightly doped second portion and the two regions can be separated by a portion of the second layer. Fourth and fifth regions of opposite type conductivity are disposed within the third region and form PN junctions therewith. The fourth and fifth regions are preferably heavily doped. The fourth region is disposed within the second portion of the third region while the fifth region can be disposed primarily within the first portion of the third region. A first gate structure is disposed atop the third, fourth and fifth regions and in response to an appropriate bias, provides an opposite type conductivity channel coupling the fourth and fifth regions In one embodiment, a portion of the third region can be prepared to be responsive to light and thus provide for light activation of the junction between the third and fifth regions. In another embodiment, a terminal can be connected to the third region to provide current initiated conduction across the junction between the third and fifth regions. In a still further alternate embodiment, a second insulated gate can be disposed over a channel portion of the third region disposed between the fourth region and the second layer. In response to an appropriate bias, the second insulated gate induces a channel within the channel portion of the third region connecting the fourth region to the second layer.

An anode electrode is disposed in ohmic contact with the second region and a cathode electrode is disposed in ohmic contact with the third and fifth regions. A substrate electrode is attached to the first layer and means are provided for coupling the substrate electrode to the cathode electrode. When the first insulated gate, disposed over the fourth and fifth regions, is appropriately biased to establish a channel coupling the fourth and fifth regions, and when the junction between the third and fourth regions is forward biased, an active device which, for instance, can be a lateral PNPN device is activated initiating a lateral current flow through the fourth and fifth regions of the device and between the anode and cathode electrodes. The anode-cathode current flow also supplies a base drive current to two inherent bipolar transistors. A first inherent bipolar transistor comprises the second region, the first region, the second layer and the second region forming a lateral PNP transistor between the cathode and anode electrodes. The second inherent transistor comprises the first layer, second layer and second region forming a vertical PNP transistor between the substrate and anode electrodes. The first active device comprising a lateral PNPN structure provides sufficient base drive to fully turn on both inherent bipolar transistors.

A method of fabricating a semiconductor device in accordance with the present invention includes the following steps. Initially, a body of semiconductor material comprising a first heavily doped layer of one type conductivity with a second lightly doped layer of opposite type conductivity disposed atop the first layer is provided. Thereafter, a first or buffer region of opposite type conductivity is established in the lightly doped second layer. A second region of one type conductivity is disposed within the first region and the second region forms a PN junction with the first region. A third region of one type conductivity is also disposed within the second layer in opposed relation to the first and second regions. Thereafter, fourth and fifth regions of opposite type conductivity are established within the third region. The third region preferably includes a heavily doped first portion and a more lightly doped second portion. The fourth region is disposed entirely within the more lightly doped second portion of the third region while the fifth region is primarily disposed within the first heavily doped portion of the third region. A first electrode is disposed in ohmic contact with the second region and a second electrode is disposed in ohmic contact with the third and fifth regions. In addition, a substrate electrode is applied in ohmic contact with the first layer and means are provided for coupling the substrate electrode to the cathode electrode.

An insulated gate structure is provided atop the third region proximate the fourth and fifth region and preferably extending over the fourth and fifth regions to conductively couple the fourth region to the fifth region in response to an appropriate gate bias.

The present invention thus provides a semiconductor device which exhibits improved conductivity and a method for fabricating that device. More particularly, the disclosed structure provides and fully utilizes the inherent lateral and vertical bipolar transistors by providing a sufficient base drive to fully turn on both inherent transistor structures. Thus the disclosed device can be operated with increased current density. Moreover, a single insulated gate, in response to an appropriate bias, turns the device off.

BRIEF DESCRIPTION OF THE DRAWINGS

The features of the invention which are believed to be novel are specified with particularity in the appended claims. The invention itself, both as to organization and method of operation together with additional features, objects and advantages of the monolithically integrated semiconductor device of the present invention can be best understood by reference to the following detailed description when considered in conjunction with the accompanying drawing in which:

FIG. 5 is an illustration of an alternate current activated embodiment of the monolithically integrated lateral semiconductor device in accordance with the present invention;

FIG. 6 is an illustration of a still further alternate insulated gate activated embodiment of the monolithically integrated lateral semiconductor device in accordance with the present invention;

DETAILED DESCRIPTION OF THE PREFERRED EMBODIMENTS

Figure 1:
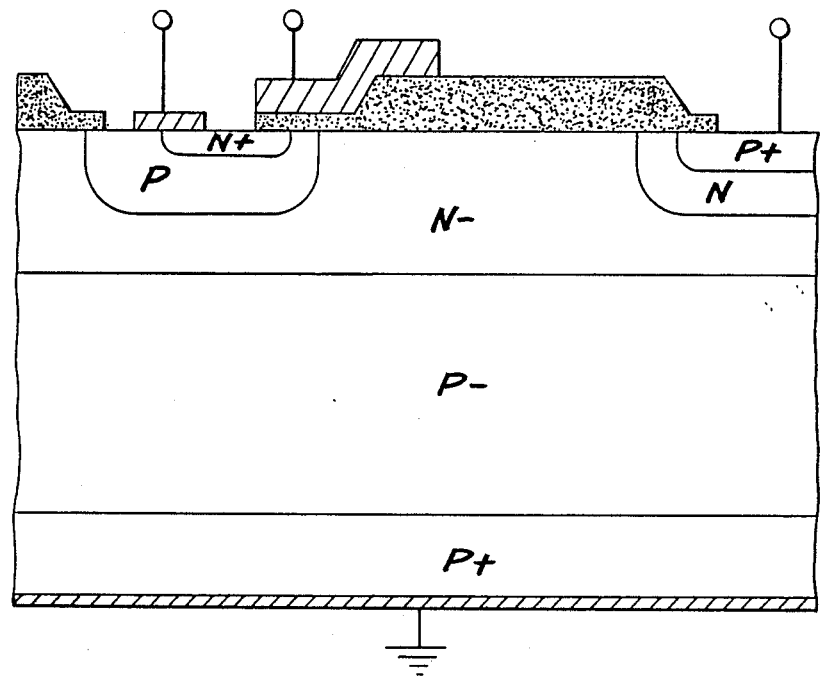
FIG. 1 is a cross-sectional illustration of a conventional lateral insulated gate transistor.
Figure 2:
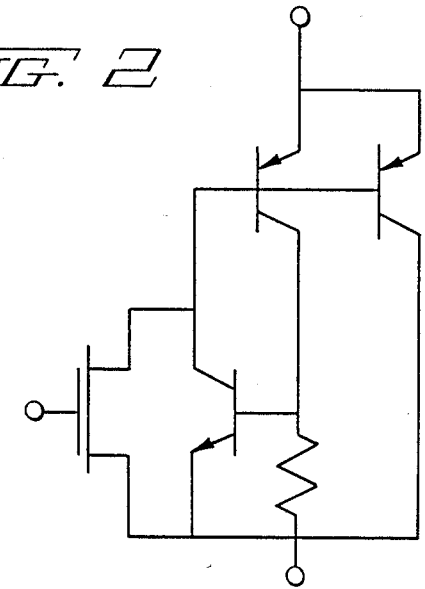
FIG. 2 is an illustration of an equivalent circuit of the insulated gate transistor of FIG. 1.

The monolithically integrated lateral semiconductor device of the present invention is applicable to a broad range of semiconductor devices and can be fabricated from a variety of semiconductor materials. The ensuing description will disclose several preferred embodiments of the monolithically integrated semiconductor device of the present invention as implemented in silicon substrates because devices fabricated in silicon substrates make up an overwhelming majority of the currently available semiconductor devices. Consequently, the most commonly encountered applications of the present invention will involve silicon substrate devices. Nevertheless, it is intended that the invention disclosed herein can be advantageously employed in germanium, gallium arsenide and other semiconductor materials. Accordingly, application of the present invention is not intended to be limited to devices fabricated in silicon semiconductor materials, but will encompass those devices fabricated in any of a number of semiconductor materials.

Moreover, while the present invention discusses a number of preferred embodiments directed to silicon semiconductor devices, it is intended these disclosures be considered as illustrated examples of the preferred embodiment of the present invention and not as a limitation on the scope or applicability of the present invention. Further, while the illustrated examples disclose the improved conductivity monolithically integrated semiconductor device in connection with insulated gate control structures, light activated structures and current activated structures, it is not intended that the monolithically integrated lateral insulated gate structures be limited to these devices. These devices are included to demonstrate the utility and application of the present invention to what are considered preferred commercial embodiments. Specifically, the present invention is additionally readily applicable to those monolithically integrated lateral structures which employ regenerative conduction and thus encompass monolithically integrated TRIACs and DIACs as well as thyristors. Further, while the present invention provides for increased current conductivity and current density, it is recognized that the attendant benefits of reduced cell size and reduced cell repeat distance will result from the improved cell structure.

Given the relationship of FIGS. 3–6, corresponding parts have been designated with the same reference numeral as an aid to understanding the description of the invention. Various parts of semiconductor elements, however, have not been drawn to scale. Certain dimensions have been exaggerated in relation to other dimensions in order to present a clearer illustration and understanding of the present invention. Although for the purposes of illustration, the preferred embodiments of the improved conductivity monolithically integrated lateral semiconductor device of the present invention are shown in each particular embodiment to include specific P and N type regions, it is understood that the teachings herein are equally applicable to monolithically integrated lateral semiconductor devices in which the conductivities of the various regions have been reversed to, for instance, provide the dual of the illustrated device. Enhancement and depletion mode structures can be similarly interchanged.

Further, although the embodiments illustrated herein are shown in two dimensional views with various regions having width and depth, it is understood that these regions are illustrations of only a portion of single cell of a device comprised of a plurality of cells arranged in a three dimensional structure. Accordingly, these regions, when fabricated in actual devices, will have three dimensions including length, width and depth.

Figure 3:
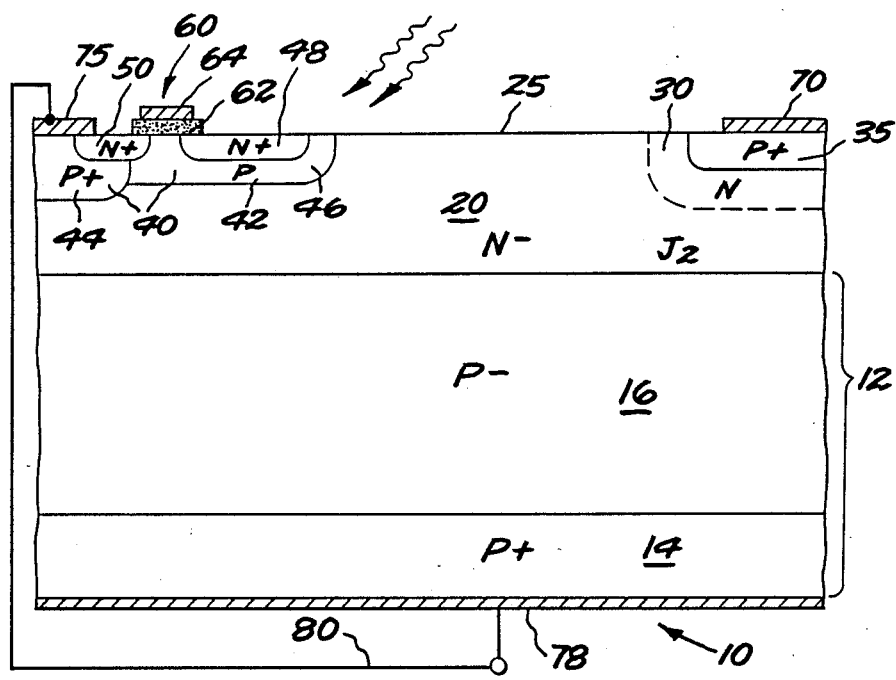
FIG. 3 is a cross-sectional illustration of a portion of a single cell of a light activated monolithically integrated lateral semiconductor device in accordance with the present invention.

Referring now to FIG. 3, a preferred embodiment of the present invention as applied to a monolithically integrated lateral semiconductor device generally designated 10 is shown. More particularly, a portion of a single cell of a device comprising an inherent lateral and an inherent vertical transistor driven by a floating cathode thyristor which is symmetric about a vertical axis disposed through the righthand portion of the illustration is shown. The monolithically integrated lateral semiconductor device 10, in accordance with the present invention, is shown to comprise a first layer 12 of one type conductivity which is shown as a P type conductivity layer. The first layer 12 can include a first heavily doped portion 14 and a second lightly doped portion 16. A second layer 20 of opposite type conductivity is disposed atop the first layer 12. The second layer 20 is illustrated as a lightly doped N type conductivity layer. In establishing the first and second layers 12 and 20, respectively, either the first or the second layer can be deposited on the other layer by epitaxial growth, or alternatively, can be established within the other layer by diffusion or implantation techniques. Similarly, either the first or second portion 14 or 16, respectively, of the first layer 12 can be the substrate and the other portion can be established thereon by epitaxial growth or by diffusion or implantation techniques.

A portion of the second layer 20 comprises a portion of the second surface 25 of the device 10. A first region 30 comprising opposite type conductivity material is established within the second layer 20 and is shown to provide an N type buffer region between the second layer 20 and the subsequently established second region 35. The second region 35 comprises one type conductivity material and is disposed within the second region 30 if it is present and forms a PN junction therewith. As illustrated, the second region 35 comprises a heavily doped P type conductivity material which is disposed entirely within the first region 30.

A third region 40 of one type conductivity is disposed within the second layer 20 and forms a first PN junction 42 therewith. As illustrated, the third region 40 comprises a first heavily doped portion 44 and a second more lightly doped portion 46. As illustrated, the third region 40 comprises P type conductivity material and also comprises a portion of the first surface 25 of the device 10. Fourth and fifth regions 48 and 50, respectively, comprising opposite type conductivity material are disposed within the third region 40. The third and fourth regions 4B and 50, respectively, are discrete from each other and a portion of the third region 40 is disposed therebetween. As illustrated, the fourth and fifth regions 4S and 50, respectively, comprise heavily doped N type conductivity material and the fourth region 4S is disposed within the second more lightly doped portion 46 of the third region 40 while the fifth region 50 is primarily disposed in the first heavily doped portion 44 of the third region 40. The first surface 25 also comprises portions of the third, fourth and fifth region.

A first insulated gate structure 60 is disposed on the first surface 25, which in response to a first appropriate bias, conductively couples the fourth and fifth regions 48 and 50, respectively and in response to a second appropriate bias, decouples the fourth and fifth regions 4S and 50, respectively. The insulated gate structure 60 (not shown) comprises an insulation layer 62 which extends over the portion of the third region 40 disposed intermediate the fourth and fifth regions 48 and 50, respectively. The insulation layer 62 can also overlap onto a portion of the fourth and fifth regions 4S and 50, respectively. A gate electrode 64 is disposed atop the insulation layer 62 and is at least coextensive with that portion of the third region 40 which is disposed between the fourth and fifth regions 48 and 50, respectively. The gate electrode 64 can also extend over an additional portion of the insulation layer 62 to reside above the fourth and fifth regions 4B and 50, respectively.

A first or anode electrode 70 is disposed in ohmic contact with the second region 35. A second or cathode electrode 75 is disposed in ohmic contact with the third and fifth regions 40 and 50, respectively. A third electrode 7S is disposed in ohmic contact with the first layer 14 and means 80 are provided for electrically coupling the third electrode 7S to the second electrode 75.

A means for activating an inherent lateral four layer structure shown in FIG. 3 to comprise the second region 35, first region 30, second layer 20, third region 40 and fourth region 4S such as a lateral PNPN structure is provided. A portion of the third layer 40 which forms a portion of the first surface 25 is conditioned to be light responsive. Thus, in response to appropriate incident radiation, the lateral four layer structure is activated and regenerative conduction is established provided the first gate 60 is appropriately biased. The active device portion comprising the four layer structure can also be activated by other mechanisms such as the current activation mechanism shown in FIG. 5 or a second insulated gate such as that shown in FIG. 6. Once the lateral PNPN device have been activated, a sufficient current flow is provided within the second layer 20 of the device 10 to activate a lateral inherent bipolar transistor comprising second region 35, first region 30, the second layer 20 and the first portion 44 of third region 40 as well as the vertical inherent bipolar transistor comprising the first layer 1, the second layer 20 and the second region 35. More particularly, the regenerative current flow in the lateral four layer active portion of the device 10 structure provides a base drive to the second layer 20 which activates both the lateral and vertical inherent bipolar transistors to provide improved current conduction between the anode and cathode/substrate electrodes 70 and 75/7S respectively, of the device 10. In prior devices, the base drive supplied to the inherent vertical bipolar transistor was insufficient to fully utilize any inherent structures that may be present.

Figure 3A:
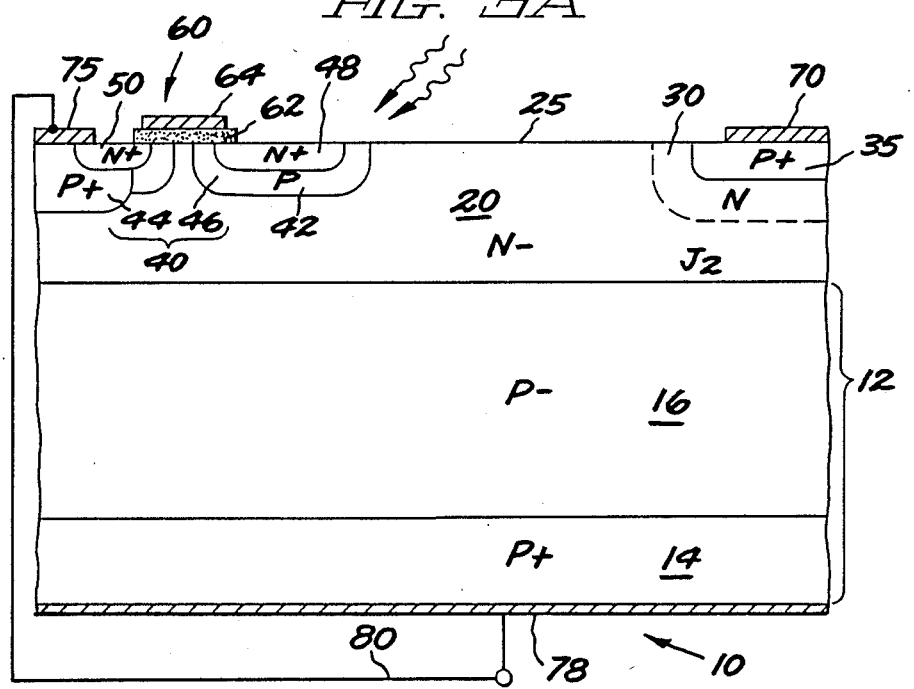
FIG. 3A is a cross-sectional illustration of a portion of a single cell of an alternate embodiment of the monolithically integrated lateral semiconductor device of FIG. 3.

In FIG. 3A, the third region 40 is shown to comprise discrete first and second regions 44 and 46, respectively, having a portion of the second layer 20 disposed therebetween. In coupling the fourth and fifth regions 4S and 50, respectively, an accumulation layer can be established in the intervening portion of the second layer 20 by the insulated gate 60.

Figure 4:
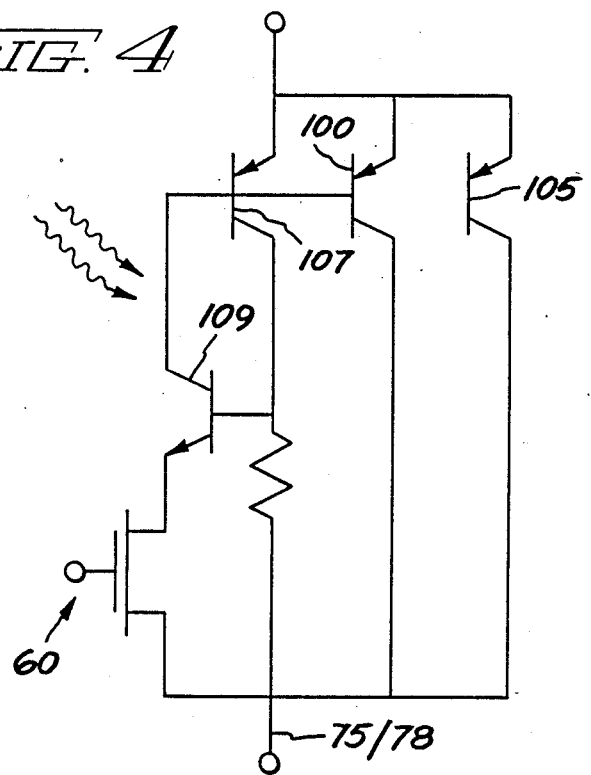
FIG. 4 is an illustration of an equivalent circuit of the monolithically integrated lateral semiconductor device of FIGS. 3 and 3A.

Referring now to FIG. 4, an equivalent circuit of the device of FIGS. 3 and 3A is illustrated. More particularly, the inherent lateral and vertical PNP transistors are shown as PNP transistors 100 and 105. The four layer lateral structure illustrated in FIGS. 3 and 3A as a PNP structure is shown to comprise a cascaded connection of a PNP and an NPN transistor 107 and 109, respectively. The insulated gate 60 is illustrated as coupling the emitter of the regenerative thyristor to the cathode electrode.

Referring now to FIG. 5, an alternate preferred embodiment of a current activated device 10 in accordance with the present invention is shown. A sixth region 90 of one type conductivity is disposed within the third region 40 and forms a P- contact 90 within the P- base region 40. In response to the application of an appropriate current to the P- contact region 90, the junction between the third region 40 and the fourth region 4S is forward biased establishing a current flow to the cathode electrode 75 which is sufficient to forward bias the junction 42 between the second layer 20 and the third region 40 to thus activate the active portion of the lateral device 10.

Referring now to FIG. 6, an alternate preferred embodiment of the monolithically integrated lateral semiconductor device of the present invention is shown. More particularly, in this embodiment, a second insulated gate 120 is disposed on the first surface 25 of the device 10. The second insulated gate 120 is disposed atop a second channel portion of the third region 40 which is disposed between the fourth region 4S and the second layer 20. The second insulated gate 120 comprises an insulation layer 122 and a gate electrode 124. The insulation layer 122 is preferably an extension of the insulation layer 62 and is preferably formed at the same time with the same thickness The insulation layer 122 is disposed atop the first surface 25 and is at least coextensive with the channel portion of the third region 40 and can extend to overlap the fourth region 48 and the second layer 20. Similarly, the gate electrode 124 is disposed atop the insulation layer 122. The gate electrode 124 is at least coextensive with the channel portion of the third region 40 and can extend to overlap a portion of the fourth region 4S and the second layer 20. In response to an appropriate bias, the second insulated gate structure 120 establishes a channel through the third region 40 providing for the flow of opposite type conductivity carriers to the fourth region 4S to forward bias the junction between the third and fourth regions 40 and 4S and to initiate regenerative conduction within the lateral four layer structure comprising the second region 35, the first region 30, the second layer 20, the third region 40 and the fourth region 48.

Figure 7A:
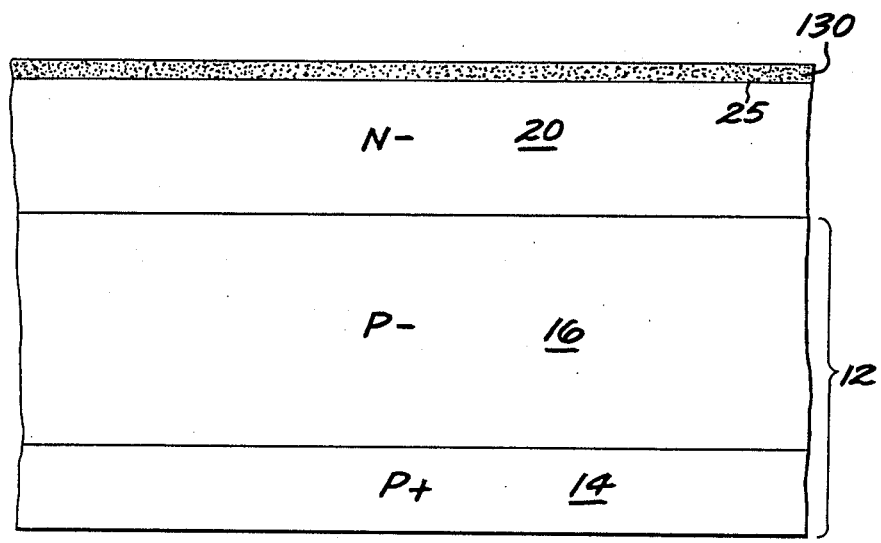
FIGS. 7A-7J are illustrations of a cross section of a monolithically integrated lateral semiconductor device during successive steps performed in the process of fabricating the device.

Referring now to Figure 7A, method of fabricating the monolithically integrated lateral semiconductor device of the present invention is illustrated in FIGS. 7A-7H to comprise the following steps. A semiconductor structure comprising a body of semiconductor material comprising a first layer 12 of one type conductivity semiconductor material and second layer 20 of opposite type semiconductor is initially provided. In the illustrated embodiment, the first layer 12 is shown to comprise P type conductivity material having a first heavily doped portion 14 and a second lightly doped portion 16. Either the first or second portions 14 and 16, respectively, can comprise the substrate and the other portion can be established thereon by, for instance, epitaxial techniques or doping techniques such as implantation and diffusion techniques.

The second layer 20 is established atop the first layer 12. The second layer 20 can be established by similar epitaxial growth techniques or doping techniques such as implantation or diffusion techniques. The second layer 20 is illustrated to comprise a lightly doped opposite type conductivity layer shown as a lightly doped N type conductivity layer. Thereafter a first protective layer 130 such as an oxide layer is disposed atop the first surface 25 of the second layer 20.

Figure 7B:
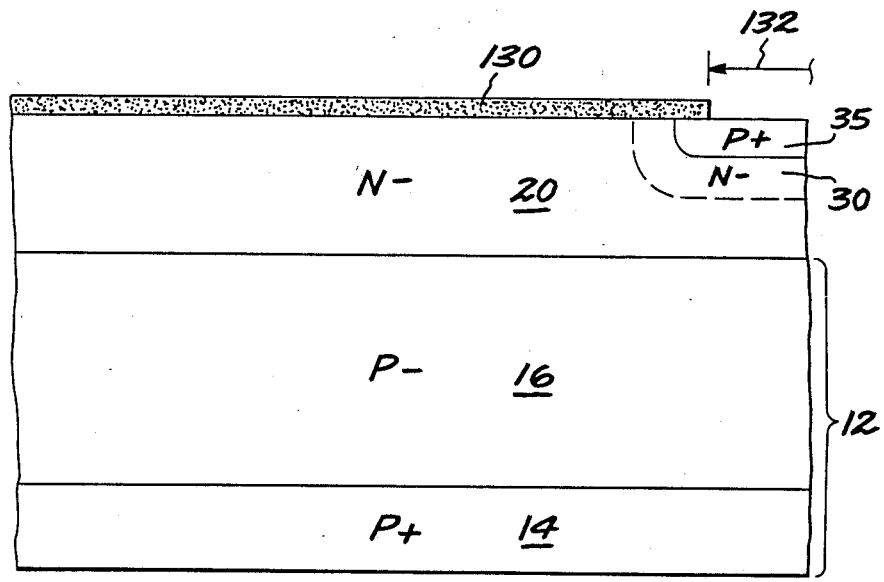

A first window 132 shown in FIG. 7B, is opened through the first protective layer and a moderately doped opposite type conductivity first region 30 is established therein by implanting opposite type conductivity carriers into the second layer 20 through the first window 130 and then driving the implanted dopants to a sufficient depth to establish a lightly doped buffer region in the second layer 20. Thereafter, a second doping is made through the same first window 130 to establish the second one type conductivity region 35 shown as a P+ region. The second region 35 is thus disposed entirely within and in predefined relation with the first region 30.

Figure 7C:
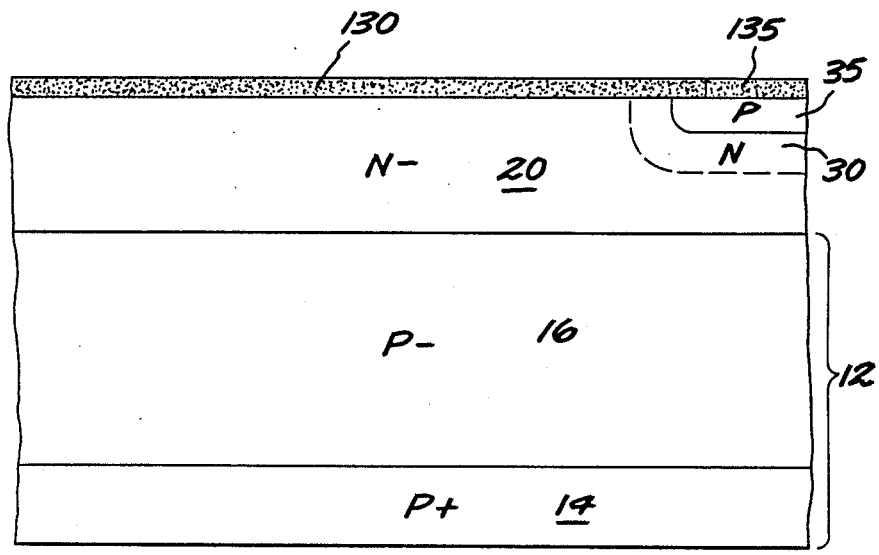

Thereafter, a second protective layer 135, such as an oxide layer shown in FIG. 7C, is disposed within the first window 132.

Figure 7D:
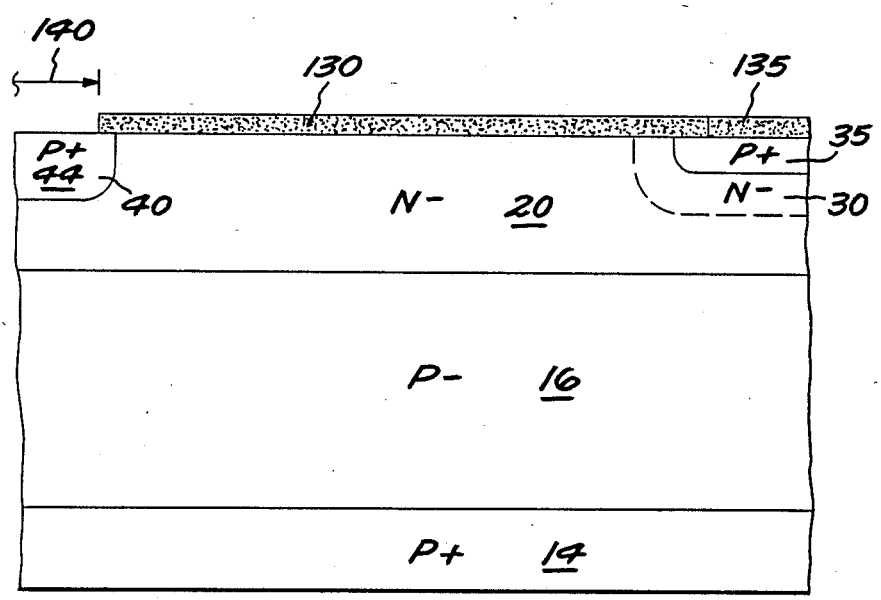

A second window 140 shown in FIG. 7D, is then opened through the first protective layer 130. A heavy concentration of one type conductivity impurities is implanted through the second window 140 into the second layer 20 to establish a first heavily doped portion 44 of the third region 40.

Figure 7E:
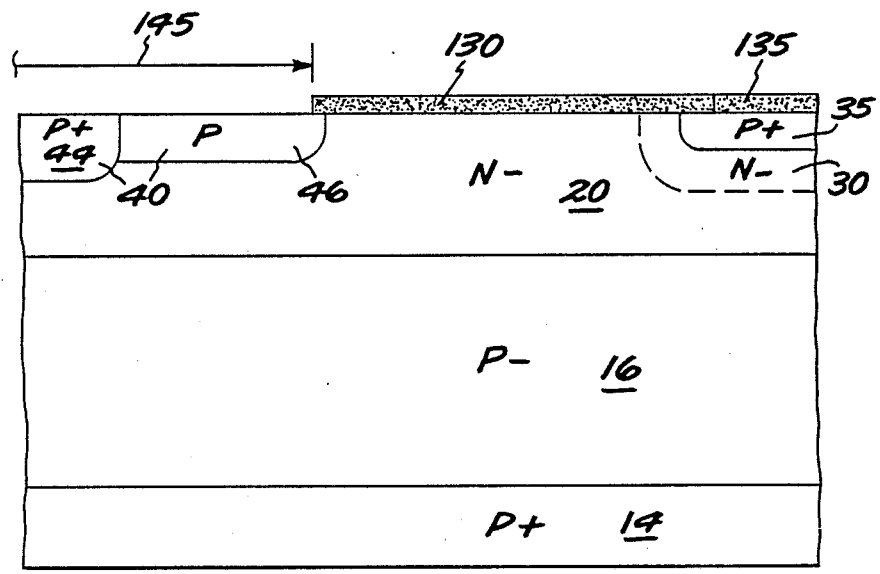
Figure 7F:
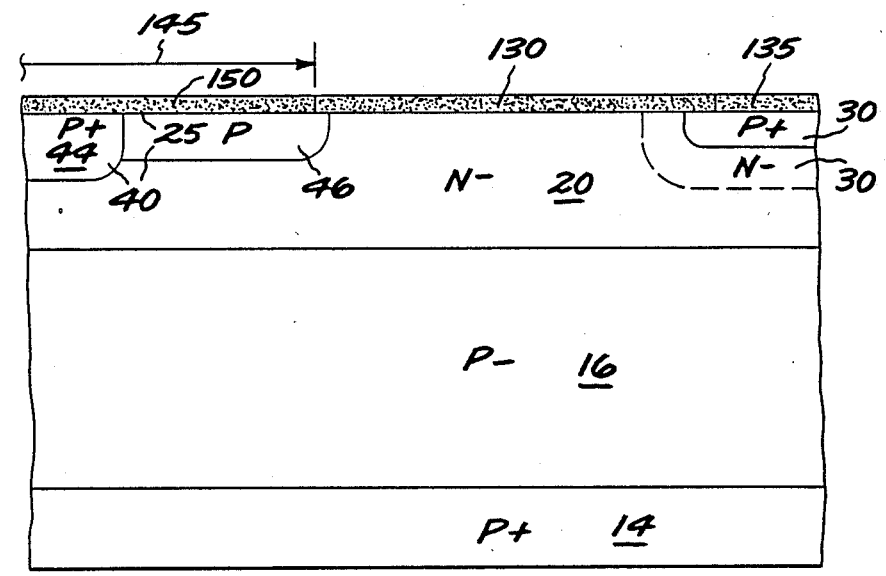
Figure 7G:
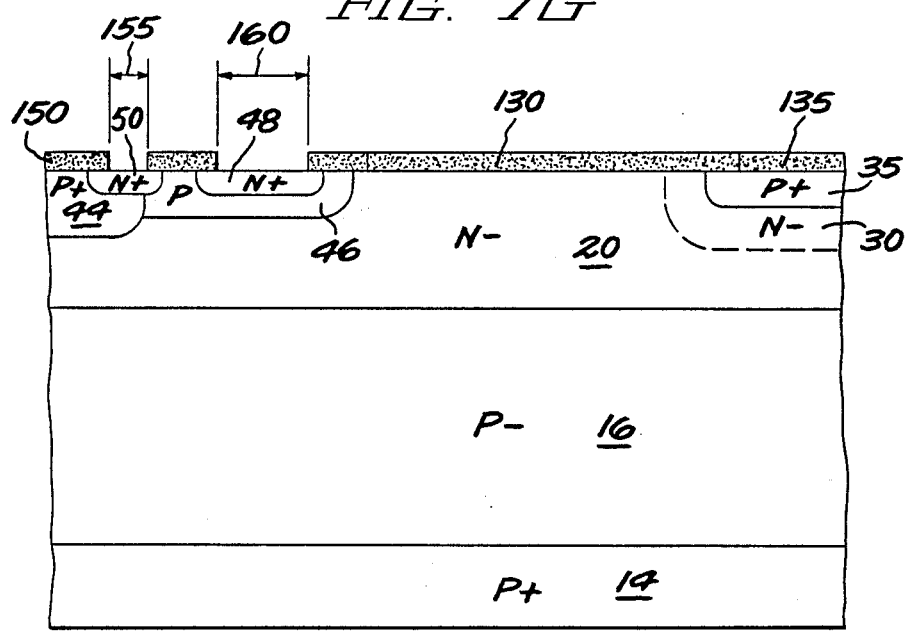
Figure 7H:
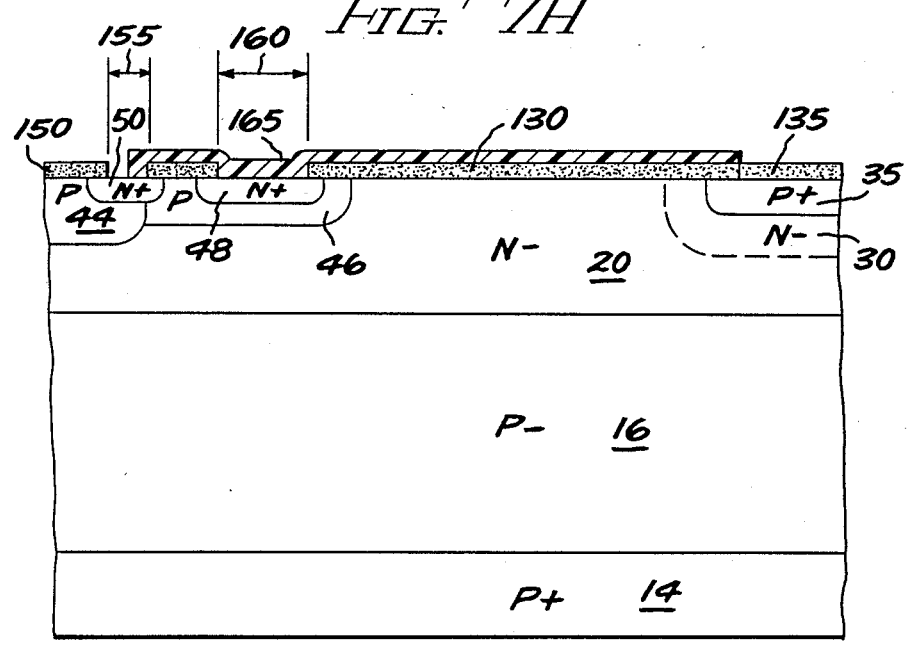
Figure 7I:
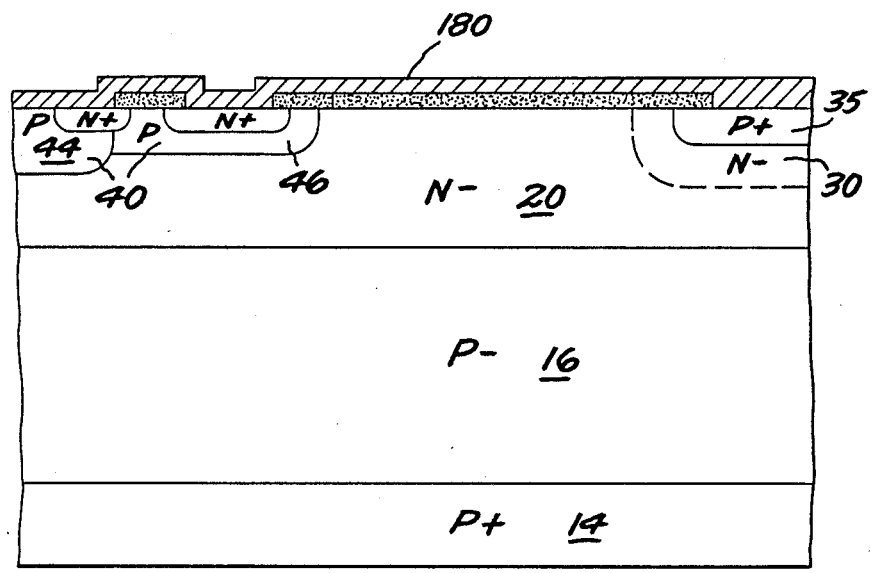
Figure 7J:
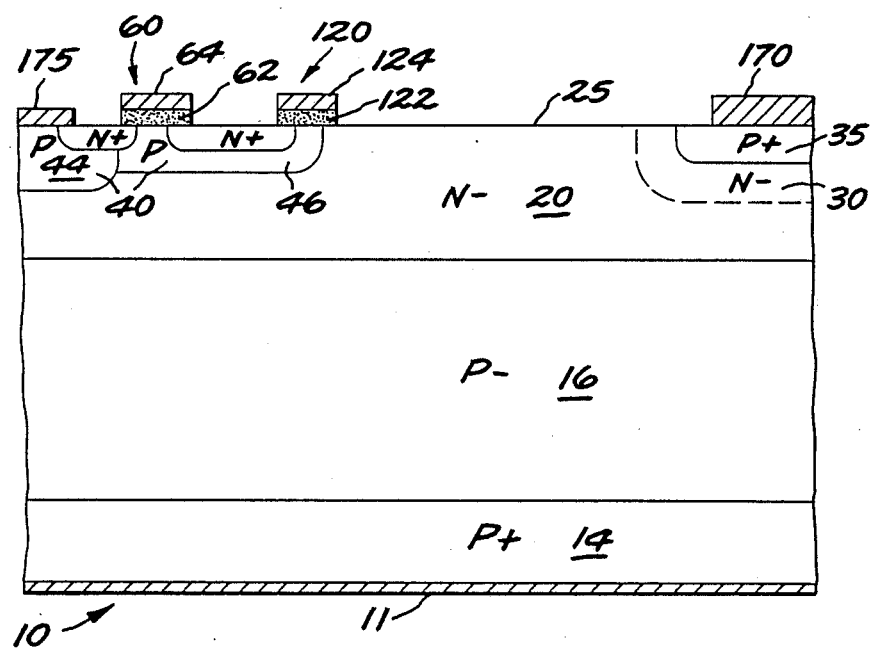

Thereafter, as shown in FIG. 7E, a third window 145 which encompasses the second window 140, is established through the first protective layer 130. A second doping with one type conductivity impurities is performed through the third window 145 to establish the second portion 46 of the third region 40. Thereafter, another protective layer 150, shown in FIG. 7F, is disposed on the first surface 25 within the third window 145. Subsequently, and as shown in FIG. 7G, the protective layer 150 is patterned using, for instance, photolithographic techniques to open fourth and fifth windows 155 and 160, respectively, therethrough. Subsequently, a heavy concentration of opposite type conductivity impurities such as N type impurities are implanted through the fourth and fifth windows 155 and 160, respectively, and are driven to establish the fourth and fifth regions 48 and 50, respectively. Thereafter, as shown in FIG. 7H, a third protective layer such as a photoresist layer 165, is disposed atop a portion of the protective layer 130 and 150. As shown in FIG. 7I, a portion of the second protective layer 130 is stripped from the surface of the device 10 by, for instance, employing a buffered hydrofluoric acid etch. The photolithographic layer 165 is also removed. Subsequently a metallization layer 180 such as doped aluminum, is disposed on the exposed surface 25 of the device 100. As shown in FIG. 7J, the metallization layer 180 can be patterned to provide a cathode electrode 75 disposed in ohmic contact with the third and fifth regions 40 and 50, respectively, as well as an anode electrode 70 in ohmic contact with the second region 35. In addition, the metallization layer 180 provides gate electrodes 64 and 124 disposed atop insulating layer 150.

A metallization layer is also applied to the heavily doped portion of the first layer to provide a substrate electrode 11.

It is to be recognized that while the preferred embodiments of the present invention has been disclosed with respect to a monolithically integrated lateral semiconductor device comprising inherent transistors driven by lateral floating cathode thyristor, it should be recognized that the present invention is not so limited but is equally applicable to other monolithically integrated lateral devices in which a first inherent portion of the device is used to drive a second inherent portion of the device.

While the preferred embodiments of the present invention have been illustrated and described, it is clear that the invention is not so limited. Numerous modifications and changes, variations and substitutions and equivalents will occur to those skilled in the art without departing from the true spirit and scope of the present invention. Accordingly, it is intended that the invention herein be limited only by the scope of the appended claims.

What is claimed is:

1. A monolithically integrated lateral semiconductor device having a substantially planar upper surface comprising:
   a first layer of one type conductivity;
   a second layer of opposite type conductivity forming a portion of said surface of said device;
   a first region of opposite type conductivity disposed within said second layer and forming a portion of said surface of said device;
   a second region of one type conductivity disposed within said first region and forming a portion of said surface;
   a third region of one type conductivity disposed within said second layer and forming a portion of said surface;
   a fourth region of opposite type conductivity disposed within said third region forming a first PN junction with said third region and said fourth region forming a portion of said surface;
   a fifth region of opposite type conductivity disposed within said third region forming a second PN junction with said third region and said fifth region forming a portion of said surface;
   an insulated gate structure associated with a portion of said third region disposed between said fourth and fifth regions, said insulated gate structure, in response to an appropriate bias couples said fourth and fifth regions;
   a first electrode disposed in ohmic contact with said second region;
   a second electrode disposed in ohmic contact with said third and fifth regions;
   a third electrode disposed in ohmic contact with said first layer; and
   means for coupling for said third electrode to said second electrode.

2. The semiconductor device of claim 1 wherein a portion of said third region is light sensitive and in response to the receipt of incident radiation, initiates current flow within said third region forward biasing said first PN junction.

3. The semiconductor device of claim 1 wherein said third region includes a heavily doped contact region and a fourth terminal is applied to said contact region, said contact region, in response to an appropriate current flow, forward biases said first junction and establishes lateral regenerative conduction in a lateral regenerative structure comprising the second region, the first region, the second layer, the third region and the fifth region.

4. The semiconductor device of claim 1 further comprising a second insulated gate structure associated with a portion of the third region disposed between said fourth region and said second layer, said second insulated gate structure, in response to an appropriate applied bias, inducing a channel for forward biasing said first PN junction.

5. The semiconductor device of claim 4 further including means for simultaneously biasing said first and second insulated structures.

6. The semiconductor device of claim 1 wherein said fourth region is electrically isolated from said second electrode.

7. The semiconductor device of claim 1 wherein said fourth region is coupled to said second electrode through said first insulated gate structure and said fifth region.

8. The semiconductor device of claim 1 wherein said third region comprises a first heavily doped portion and a second more lightly doped portion.

9. The semiconductor device of claim 8 wherein said first portion is discrete from said second portion.

* * * * *